(12) United States Patent
Caldwell

(10) Patent No.: US 7,884,629 B2
(45) Date of Patent: Feb. 8, 2011

(54) PROBE CARD LAYOUT

(75) Inventor: John Caldwell, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/512,844

(22) Filed: Jul. 30, 2009

(65) Prior Publication Data

US 2009/0289651 A1 Nov. 26, 2009

Related U.S. Application Data

(62) Division of application No. 11/592,425, filed on Nov. 3, 2006, now Pat. No. 7,573,276.

(51) Int. Cl.
*G01R 31/02* (2006.01)
(52) U.S. Cl. .................... 324/754; 324/758
(58) Field of Classification Search .............. 324/158.1, 324/754–765
See application file for complete search history.

(56) References Cited

U.S. PATENT DOCUMENTS

| | | | |
|---|---|---|---|
| 5,736,850 A | 4/1998 | Legal | |
| 6,011,405 A | 1/2000 | Sikora | |
| 6,246,245 B1 | 6/2001 | Akram et al. | |
| 6,246,250 B1 | 6/2001 | Doherty et al. | |
| 6,300,786 B1 | 10/2001 | Doherty et al. | |
| 6,337,577 B1 | 1/2002 | Doherty et al. | |
| 6,466,047 B1 | 10/2002 | Doherty et al. | |
| 6,639,417 B2 * | 10/2003 | Takao | 324/765 |
| 6,948,149 B2 * | 9/2005 | Goodwin | 716/21 |
| 7,010,451 B2 * | 3/2006 | Dorough et al. | 702/117 |
| 7,165,004 B2 * | 1/2007 | Dorough et al. | 702/119 |
| 7,259,028 B2 | 8/2007 | Takiar et al. | |
| 7,279,919 B2 | 10/2007 | Volkerink et al. | |
| 7,532,024 B2 * | 5/2009 | Balog | 324/765 |
| 2007/0247140 A1 | 10/2007 | Mayder et al. | |

OTHER PUBLICATIONS

LaPedus, Mark,; "NAND test costs sour out of control," EETimes, Jul. 21, 2006, 2 pages.

* cited by examiner

*Primary Examiner*—Ha Tran T Nguyen
*Assistant Examiner*—Joshua Benitez
(74) *Attorney, Agent, or Firm*—Fletcher Yoder

(57) ABSTRACT

Multi-touchdown, parallel test probe cards having probe elements arranged to provide greater efficiency during testing of a substrate having a plurality of die thereon. Probe elements may be arranged in a number of configurations that allow for efficient usage of the probe elements.

11 Claims, 10 Drawing Sheets

PROBE CARD LAYOUT

CROSS-REFERENCE TO RELATED APPLICATION

This application is a divisional of U.S. patent application Ser. No. 11/592,425, which was filed on Nov. 3, 2006.

BACKGROUND OF THE INVENTION

1. Field of the Invention

The present invention, in various embodiments, relates generally to probe cards, and, more specifically, to arrangements of probe elements on a probe card.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Generally, NAND memory chips are manufactured and tested in parallel. Conventionally, a grid of die is formed on a substrate using semiconductor manufacturing techniques. Once the die are formed, but before the substrate is diced to form chips, the die are tested for electrical functionality and quality control. Testing certain types of die, such as NAND memory, can take a relatively long time, so a group of die is often tested concurrently, or "in parallel," with a parallel test probe card. Typically, the probe card includes a plurality of probe elements, which are each configured to test a single die.

Probe cards often have fewer probe elements than there are die on the substrate. Automated test equipment, which test the die via the probe card, have a finite capacity to test die in parallel. For example, signal bandwidth or processing power may limit the number of die that the automated test equipment can test at once. Thus, to test all of the die on a substrate, the die are divided into multiple groups of die, and the die within each group are tested in parallel. During testing, the probe card is usually stepped across the substrate after each group of die is tested, until each of the groups, and thus all of the die on the substrate, have been tested. Each instance of testing a group of die in parallel on a single substrate is generally referred to as a "touchdown." Thus, for example, half of the die on the substrate may be tested in parallel during a first touchdown, and the other half of the die on the substrate may be tested in parallel during a second touchdown.

Unfortunately, some probe cards do not always use the automated test equipment to its full capacity. Frequently, the probe elements on the probe card are arranged such that some probe elements are not used during some touchdowns. For example, the probe elements may be arranged so that every probe element aligns with a die when a first group of die is tested, but some of these probe elements may be unused when subsequent groups are tested on the same substrate, wasting automated test equipment capacity and reducing throughput.

BRIEF DESCRIPTION OF THE DRAWINGS

Advantages of the invention may become apparent upon reading the following detailed description and upon reference to the drawings, in which.

DETAILED DESCRIPTION OF SPECIFIC EMBODIMENTS

Various embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming but would nevertheless be a routine undertaking of design, fabrication, and manufacture for those of ordinary skill having the benefit of this disclosure.

Some of the subsequently described embodiments may be configured to test die on a substrate without wasting probe card capacity. As explained below, certain embodiments may include probe elements arranged on a probe card such that each probe element aligns with a die each time a plurality of die on the substrate are tested. In some embodiments, the subsequently described probe cards may test multiple, non-overlapping groups of die on a substrate without leaving a probe element on the probe card idle during any of the touchdowns.

To highlight these features and others of the presently described embodiments, the following discussion describes a substrate, a die, a probe element, and a probe card. Then, several specific embodiments of probe element layouts are discussed, and an embodiment of a method for testing die on a substrate is described. Finally, an embodiment of a generalized procedure for generating probe element layouts is described.

Figure 1:
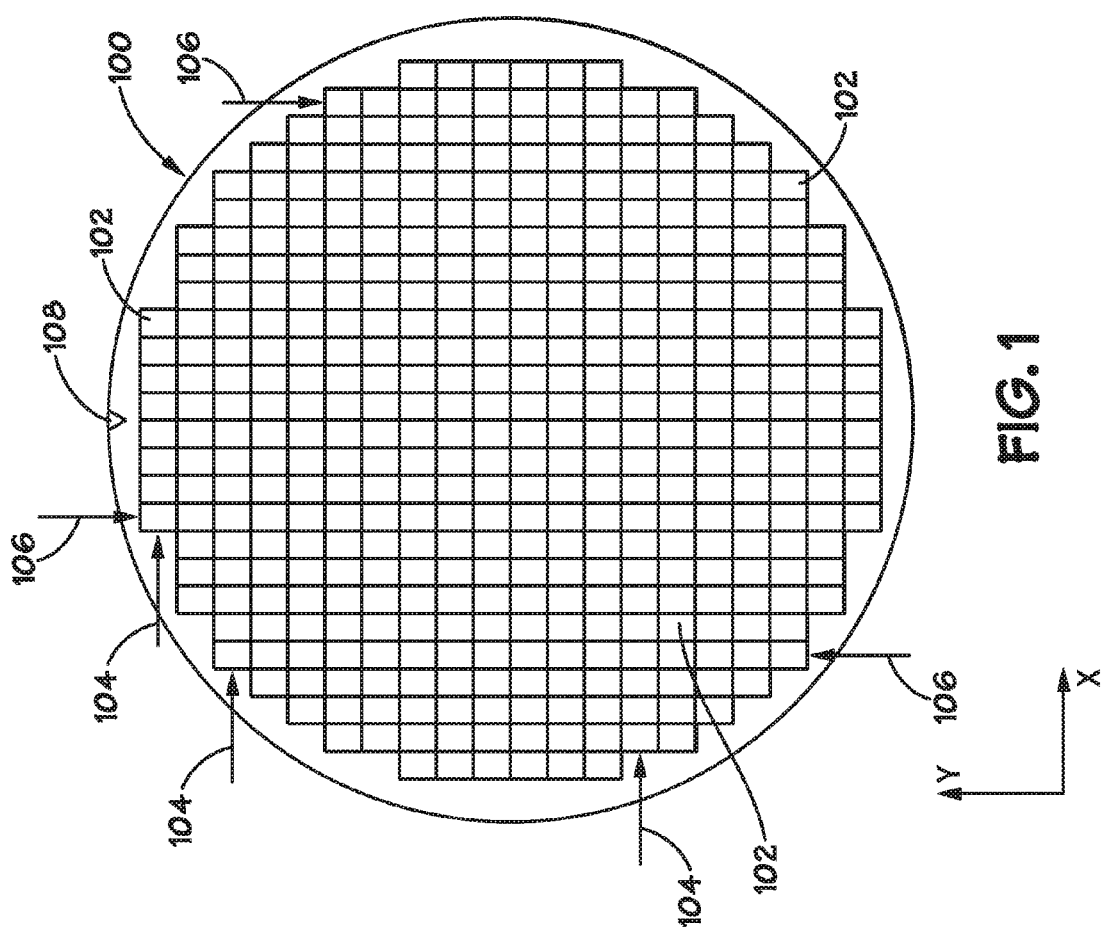
FIG. 1 illustrates a substrate in accordance with an embodiment of the present invention.

Turning to the figures, FIG. 1 illustrates a substrate 100 according to an embodiment of the invention. The substrate 100 may include a plurality of die 102 arranged in rows 104 and columns 106. The rows 104 and columns 106 may form a generally orthogonal grid or matrix of die 102. The rows 104 and columns 106 may align with a flat segment or notch 108 of the substrate 100 that indicates a particular orientation of a crystal structure of the substrate 100. The substrate 100 may include crystalline semiconductive materials, such as silicon, gallium arsenide, indium phosphide, or other materials, for example. The substrate 100 may be of a variety of sizes and support various numbers of die 102. For instance, the substrate 100 may be a 200 mm, 300 mm, or 400 mm substrate. Further, the number of die 102 may vary, depending, in part, on the size of the die 102 and the surface area of the substrate 100.

Figure 2:
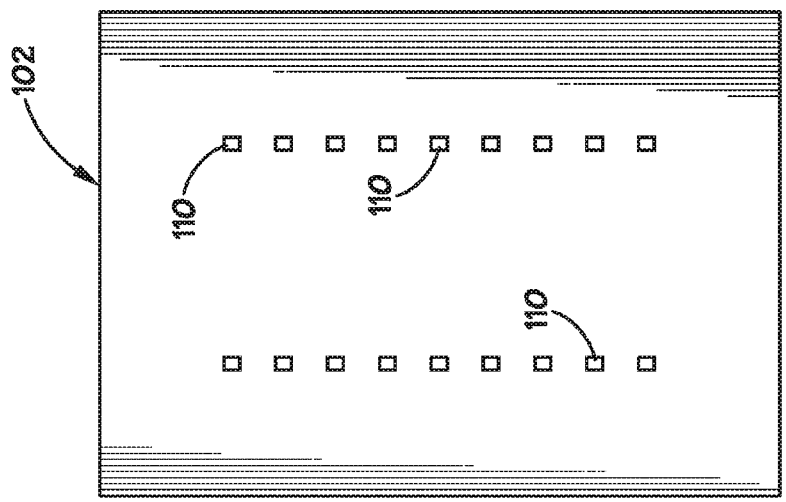
FIG. 2 illustrates a die on the substrate of FIG. 1 in accordance with an embodiment of the present invention.

FIG. 2 depicts a die 102 on the substrate 100 in greater detail. The die 102 may include one or more conductive pads 110. The illustrated pads 110 are an electrical interface to integrated circuit devices on the die 102. As explained further below, the die 102 may be tested by electrically coupling to the die 102 via the pads 110. The die 102 may include a variety of integrated circuit devices. For example, the die 102 may be referred to or include NAND flash memory, NOR flash memory, dynamic random access memory, phase change memory, magneto-resistive memory, electrically erasable programmable read only memory, or other types of memory. In another example, the die 102 may include or be referred to as a processor, a microcontroller, a graphics processor, a digital signal processor, an application specific integrated circuit, a mixed signal chip, a controller, an image sensor, a complimentary metal-oxide semiconductor image sensor, or other device.

Figure 3:
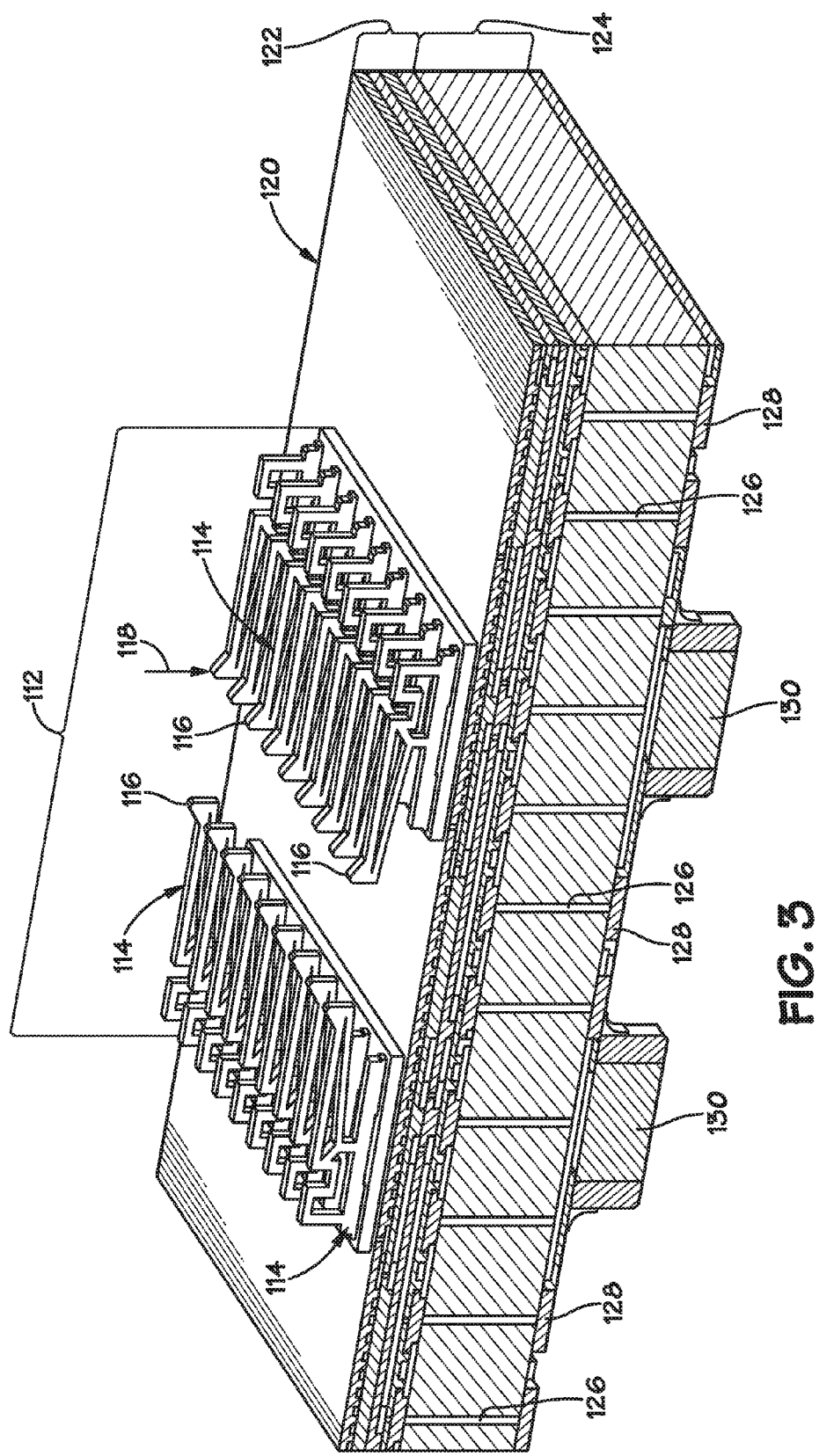
FIG. 3 illustrates a probe element in accordance with an embodiment of the present invention.

A probe element according to an embodiment of the invention, such as the probe element 112 depicted by FIG. 3, may interface with the die 102 during testing. In the present embodiment, the probe element 112 includes an array of pins 114, each having a contact 116. The contact 116 of each pin 114 may correspond to a respective one of the pads 110 on the die 102 (FIG. 2). When the probe element 112 is aligned with and pressed against the die 102, the contacts 116 may each make electrical contact with one of the pads 110. In some embodiments, the pins 114 resiliently move in response to the contact 116 being pressed against a pad 110, as depicted by arrow 118.

In the present embodiment, the probe element 112 may be coupled to a probe card 120, which may be used to interface between the probe element 112 and automatic testing equipment. The probe card 120 may include a printed circuit board (PCB) 122 having routing layers therein that couple to the pins 114. The PCB 122 may be disposed on a ceramic layer 124. The ceramic layer 122 may have conductive contacts 126 that interface with the routing layers in the PCB 122. Another set of contacts 128 may couple the contacts 126 to automatic testing equipment. Thus, the probe card 128 may spatially transform the array of signals passing through the closely spaced pads 110 on the die 102 to a larger array of contacts 128 configured to interface with the automatic testing equipment. It should also be noted that, in some embodiments, capacitors 130 may electrically isolate portions of the probe card 128 from stray signals originating in the automatic testing equipment.

Figure 4:
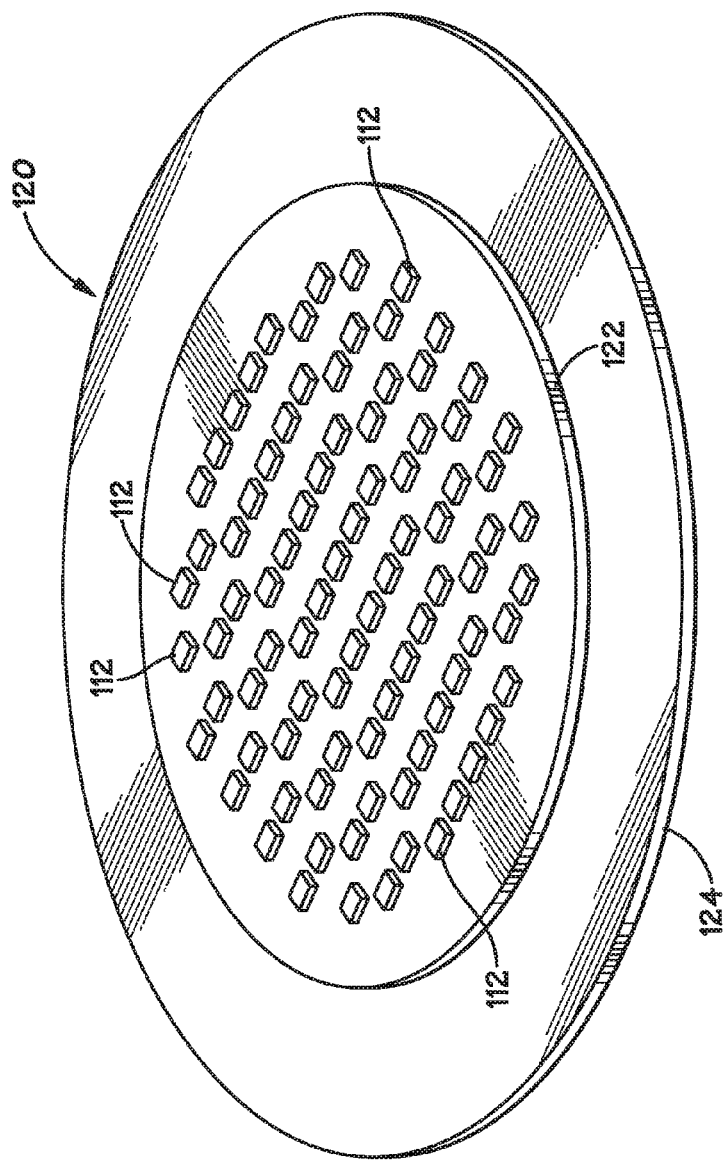
FIG. 4 illustrates a probe card in accordance with an embodiment of the present invention.

FIG. 4 is a perspective view of a probe card 128 according to an embodiment of the invention. The probe card 128 is a parallel test probe card having a plurality of probe elements 112. That is, the probe card 128 may be configured to simultaneously test a plurality of die 102 on a substrate 100. When the probe card 128 is aligned with and pressed against the substrate 100, each of the probe elements 112 may align with a die 102 on the substrate, and the contacts 116 in each of the probe elements 112 may each align with one the pads 110 on one of the die 102. In other words, the probe card 128 electrically couples to a plurality of die 102 during testing.

As explained above, each time the probe card 128 is electrically coupled to a plurality of die 102, the probe card 128 is said to have executed a "touchdown." That is, the probe card 128 has touched down and tested a group of die 102. In the present embodiment, the probe card 128 does not couple to all of the die 102 in a single touchdown. Rather, a first plurality of die 102 are tested in parallel, and then, a second plurality of die 102 are tested in parallel, as explained further in reference to FIGS. 5 and 6.

Figure 5:
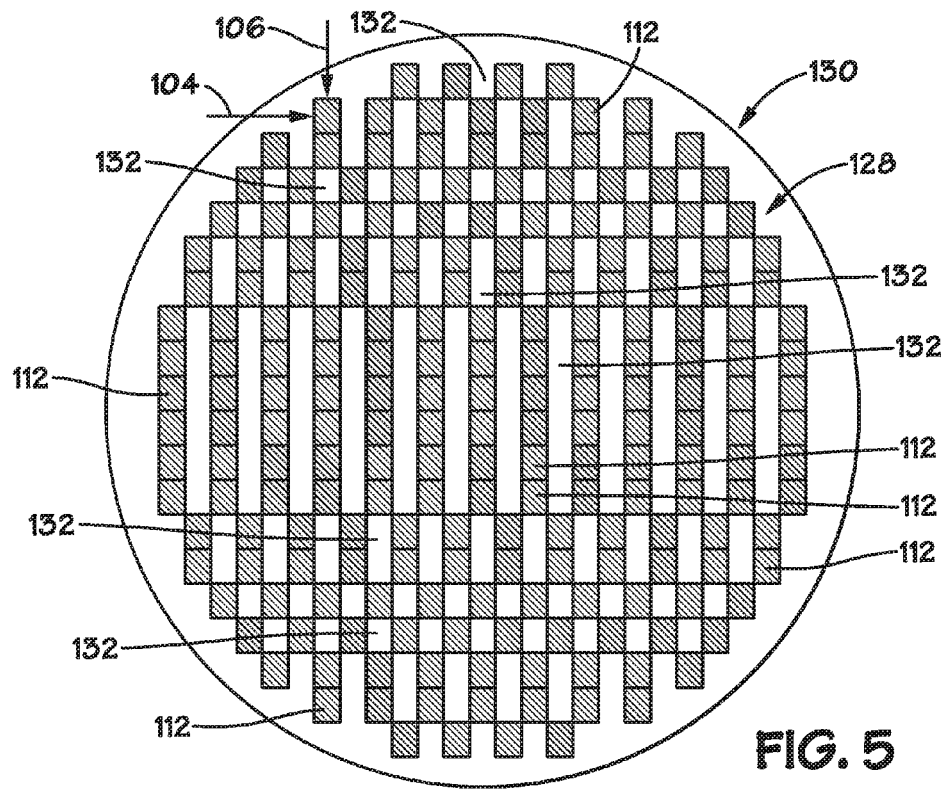
FIG. 5 illustrates a layout of probe elements on a probe card in accordance with an embodiment of the present invention.

FIG. 5 depicts a probe element layout 130 according to an embodiment of the invention. The layout 130 depicts the position of probe elements 112 on a probe card 128. It is important to distinguish between the layout 130, which depicts probe elements 112, and the substrate 100 of FIG. 1, which depicts the position of die 102. The probe elements 112 on the layout 130 each align with one of the die 102 depicted on the substrate 100 of FIG. 1. However, the number of probe elements 112 is less than the number of die 102, so there are blank or unoccupied areas 132 in the layout 130. In some embodiments, the number of probe elements 112 may be greater than 50, 100, 200, 300, or 400.

Figure 6:
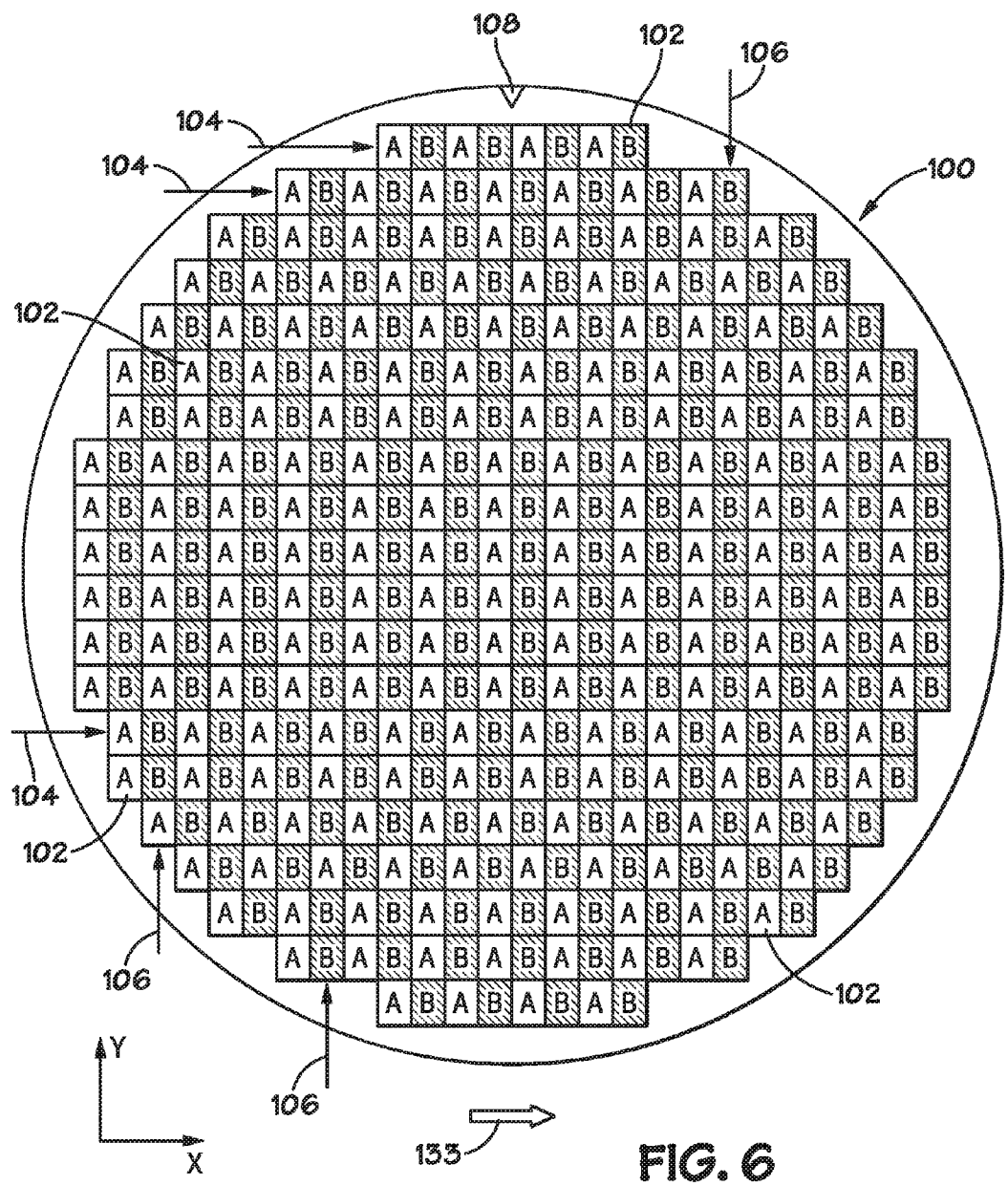
FIG. 6 illustrates a first plurality and second plurality of die on the substrate of FIG. 1 tested with the probe card of FIG. 5 in accordance with an embodiment of the present invention.

FIG. 6 illustrates the relationship between the probe element layout 130 and the die 102 on the substrate 100. In FIG. 6, the die 102 on the substrate 100 are divided into two groups: A and B, each corresponding to a touchdown of the probe card 128 on the substrate 100. That is, in the present embodiment, group A is a plurality or set of die 102 that are tested in parallel by the probe card 128, and group B is another, non-overlapping, plurality or set of die 102 that are tested in parallel by the probe card 128.

In operation, the probe card 128 is initially positioned over the substrate 100, with the substrate 100 facing upward and the side of the probe card 128 with the probe elements 112 facing downward. The probe elements 112 may then be aligned with the set of die 102 in group A, and the contacts 116 may be aligned with the pads 110 on each die 102. To initiate the first touchdown, the probe card 128 is lowered onto the substrate 100, and the pins 114 make contact with the pads 110 on the die.

Once contact is made, automated test equipment may be used to test the die 102 in group A in parallel. Various signals may be transmitted via the probe card 128 to the die 102. For example, data may be written to and recalled from memory on the die 102. In other examples, image sensors on the die 102 may transmit signals indicative of a light signal and/or various computations may be performed by logic units on the die 102.

After the plurality of die 102 in group A have been tested, the probe card 128 may advance to the next group, e.g., group B. In the present example, the probe card 128 may elevate above the substrate 100 before moving to open the connections between the pins 114 in the probe elements 112 and the pads 110 on the die 102. Then, the probe card 128 may shift to the right, as indicated by arrow 133, and align with the die 102 in group B. Aligning with the die in group B may include aligning the contacts 116 in each probe element 112 with the pads 110 on the die 102 in group B. Next, the probe card 128 may lower onto the substrate 110 to make contact, and the die 102 in group B may be tested in parallel. As explained further below, in some configurations, this process may be repeated for additional groups of die 102, depending on the ratio between the number of probe elements 112 and the number of die 102 on the substrate 100.

Advantageously, the probe card 128 may achieve 100% efficiency in the present embodiment. For purposes of the present discussion, probe card efficiency is calculated by dividing the number of testable die 102 on the substrate 100 by the product of the number of touchdowns used to test all of the testable die 102 and the number of probe elements 112 on the probe card 128. As indicated by FIG. 6, each probe element 112 on the probe card 128 tests a die 102 in group A on the first touchdown, and each probe element 112 tests a die 102 in group B on the second touchdown. Further, group A and group B together include all of the die 102 on the substrate 110, and group A and group B do not include any of the same die 102. Thus, when testing the die 102 on the substrate 100, the probe card 120 with layout 130 is 100% efficient (416 testable die/(2 touchdowns*208 probe elements)). That is, the probe card 128 may be used to its full capacity during each touchdown. In some embodiments, the probe card 128 may test an entire substrate with fewer touchdowns than a conventional probe card because each touchdown may test more die at once. Fewer touchdowns may, in turn, increase the throughput of automated test equipment.

As explained further below, other embodiments may not achieve 100% efficiency but may still offer substantial improvements over other techniques. For instance, some of the subsequently described embodiments may achieve efficiencies greater than 85%, 90%, 92%, 94%, 96%, 98%, or 99%, while testing the substrate 100 with two touchdowns, three touchdowns, four touchdowns, five touchdowns, or more. That is, certain embodiments may achieve high levels of efficiency while still satisfying constraints imposed by the automated testing equipment that prevent all of the die 102 from being tested in a single touchdown. In contrast, other layouts, such as a layout in which adjacent die on one half of the wafer are tested in parallel, may achieve maximum efficiencies of around 83%, for example.

As a further advantage, the present embodiment may rapidly test many die 102 by testing a large number of die 102 in parallel, rather than one at a time. As testing each individual die 102 may take a relatively long time, testing multiple die 102 at once may increase the overall throughput associated with the use of the probe card 128. For instance, the embodiment of FIG. 6 tests all of the die 102 on the substrate in two touchdowns. Thus, the present embodiment may test all of the die 102 in the time it takes to test two individual die 102. Other embodiments may facilitate testing all of the die 102 on the substrate 100 with fewer than four touchdowns, five touchdowns, six touchdowns, seven touchdowns, eight touchdowns, nine touchdowns, or ten touchdowns, for example.

After the die 102 are tested, the substrate 100 may undergo further processing before the die 102 are singulated, packaged, and shipped or assembled with higher level packaging to form, for example, modules. For example, fuses on the die 102 may be blown to customize the die 102 based on data gathered during testing. Die 102 that are not usable may be marked based on the data gathered during testing. Finally, the substrate 100 may be diced and the die 102 packaged. The packaged die 102 may be binned or categorized based on data gathered during testing, for instance the die 102 may be categorized based on data indicative of operating speed or data indicative of memory capacity.

Figure 7:
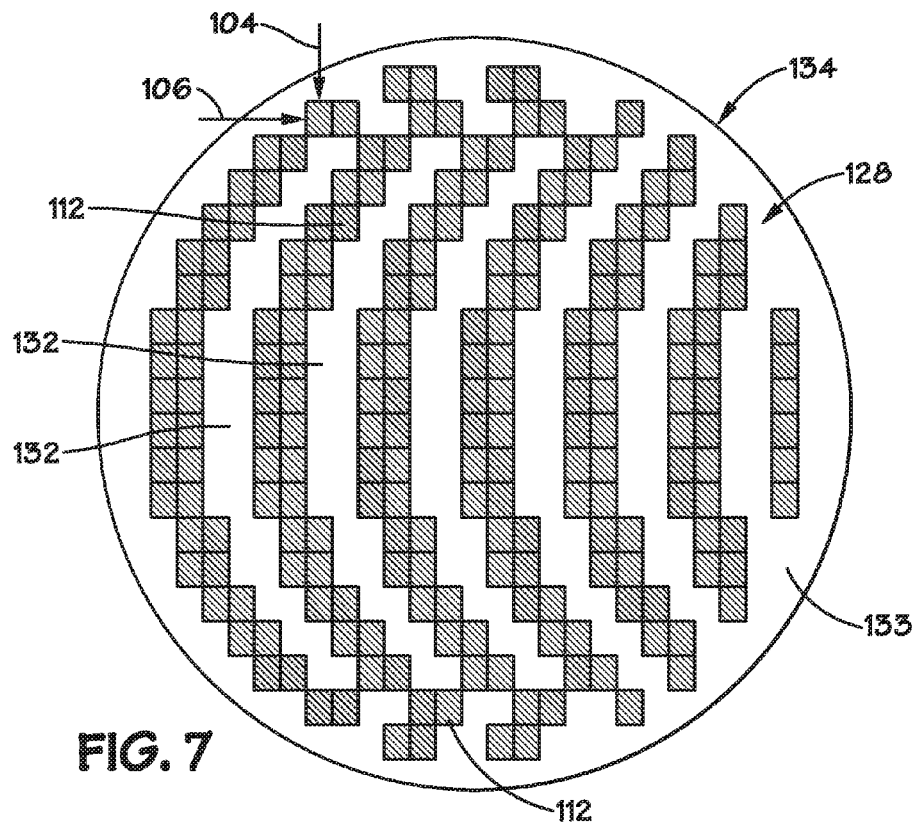
FIGS. 7-9 illustrate other layouts of probe elements in accordance with embodiments of the present invention.
Figure 8:
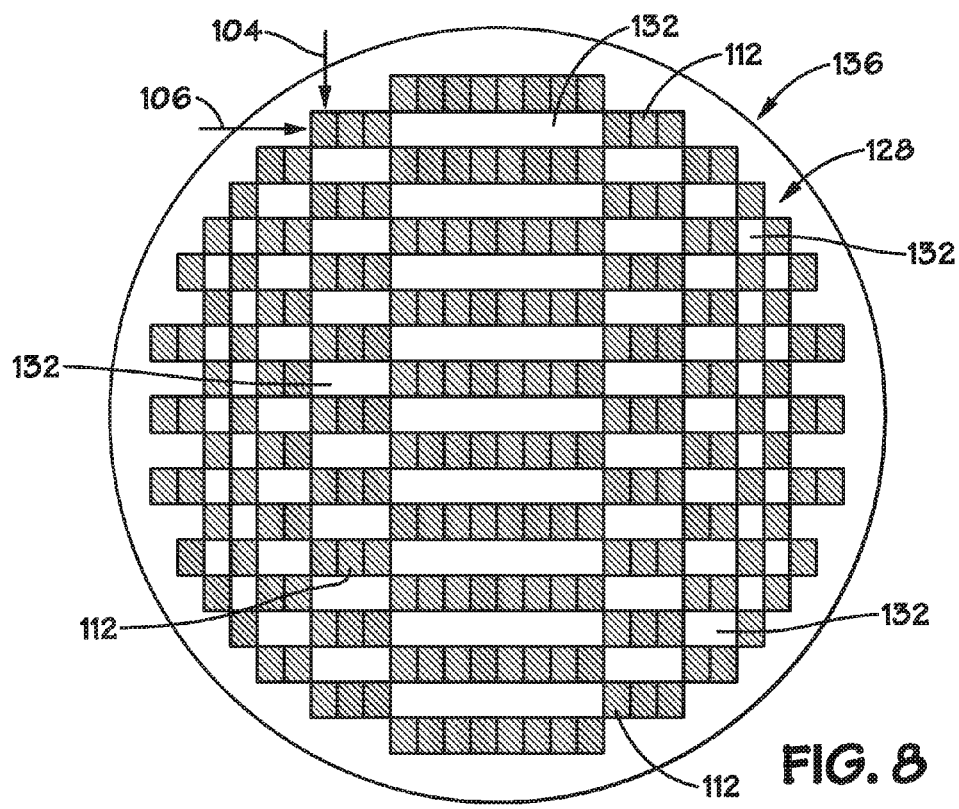
Figure 9:
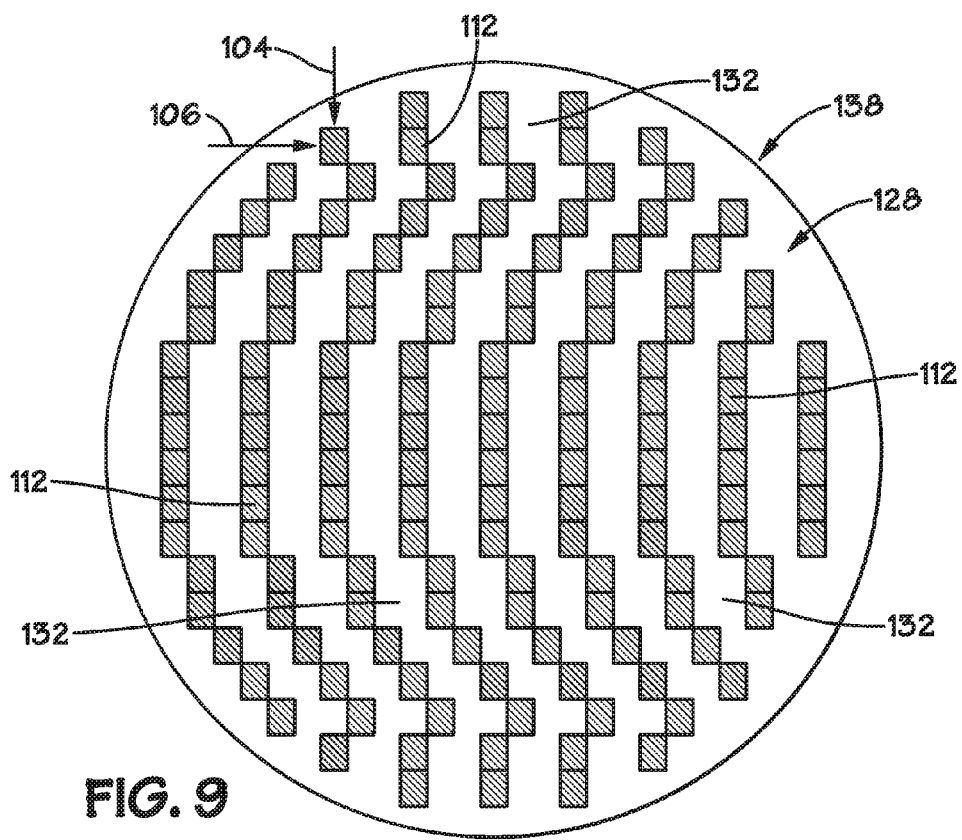

FIG. 7-9 illustrates other embodiments of probe element layouts 134, 136, and 138. In the embodiment of FIG. 7, the probe elements 112 correspond to the first two consecutive die 102 on a row 104 on the substrate 100 (FIG. 1) and every other pair of die on the row 104. That is, within a row 104, adjacent probe elements 112 are separated by unoccupied areas 132 corresponding to two die 102. During operation, a probe card 128 with layout 134 test a first group of die 102 in parallel and, then, shifts two die to the right (from the perspective of someone facing the probe elements 112) to test a second group of die 102 in parallel. Thus, the embodiment of FIG. 7 may test all of the die 102 on the substrate 100 in two touchdowns. Moreover, in some embodiments, the layout 134 may achieve an efficiency of approximately 97% with the substrate 100 depicted by FIG. 1.

FIG. 8 illustrates another embodiment of a probe element layout 136. In the embodiment of FIG. 8, the probe elements correspond to the first die 102 in a column 106 on the substrate 100 (FIG. 1) and every other die 102 in the columns 106. During testing, a probe card 128 with the layout 136 tests a first group of die and, then, shifts down one die 102 to test a different group of die 102 on the same substrate 100. The layout 136 may be 100% efficient with the substrate 100 depicted by FIG. 1 and it may test all of the die 102 on the substrate 100 in two touchdowns.

FIG. 9 depicts another embodiment of a probe element layout 138 with fewer probe elements 112. In the present embodiment, the probe elements 112 are positioned to correspond to the first die 102 in a row 104 on the substrate 100 (FIG. 1) and every third die 102 in the row 104 to the right of the first die 102. That is, the probe elements 112 in the present embodiment may be separated by unoccupied space 132 corresponding to a pair of die 102 on the substrate 100. In use, a probe card 128 with the layout 138 may test a substrate 100 with three touchdowns. After the first touchdown, the probe card 128 may shift a distance corresponding to one die 102 to the right and a second touchdown may occur. Then, the probe card 128 may elevate and shift another time to the right over a distance corresponding to a single die 102 for a third touchdown. Thus, the embodiment of FIG. 9 may be characterized as a three-touchdown probe card layout 138. The layout 138 may achieve 97% efficiency with the substrate 100 (FIG. 1).

Figure 10:
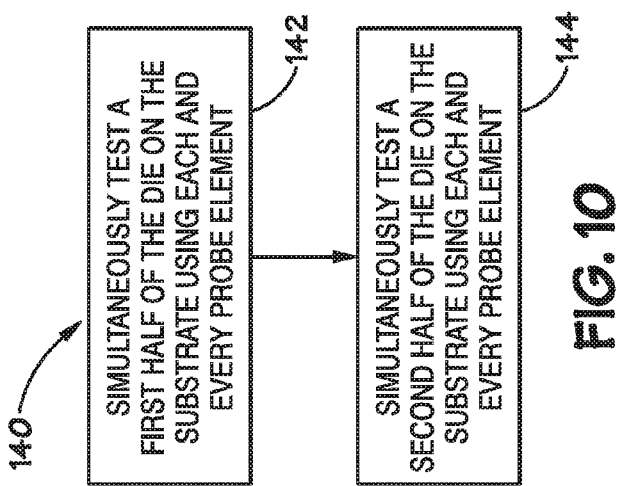
FIG. 10 illustrates a procedure for testing die on a substrate in accordance with an embodiment of the present invention.

An embodiment of a procedure for testing die 102 on the substrate 100 is depicted by FIG. 10. In a first act, a first half of the die 102 on the substrate 100 may be simultaneously tested using each and every probe element 112 on the probe card 128, as depicted by block 142. In other words, in the present embodiment, no probe elements 112 are idle while testing the first half of the die 102. Then, a second half of the die 102 on the substrate 100 are simultaneously tested using each and every probe element 112 on the probe card 128, as depicted by block 144. That is, while testing both the first half of the die 102 and the second half of the die 102, no probe element 112 on the probe card 128 is unused.

FIGS. 11-15 depict embodiment of a procedure for generating probe card layouts 146. Specifically, FIG. 11 describes acts that may be included in the procedure 146, and FIGS. 12-15 indicate how probe elements may be positioned in accordance with certain acts described by FIG. 11. It should be noted that the probe card layout developed in FIGS. 12-15 is not necessarily optimal and was selected for its explanatory value rather than its efficiency. As explained below, the terminology used to describe the layouts developed in FIGS. 12-15 may be used to concisely describe a variety of embodiments that are highly-parallel and highly efficient.

Figure 11:
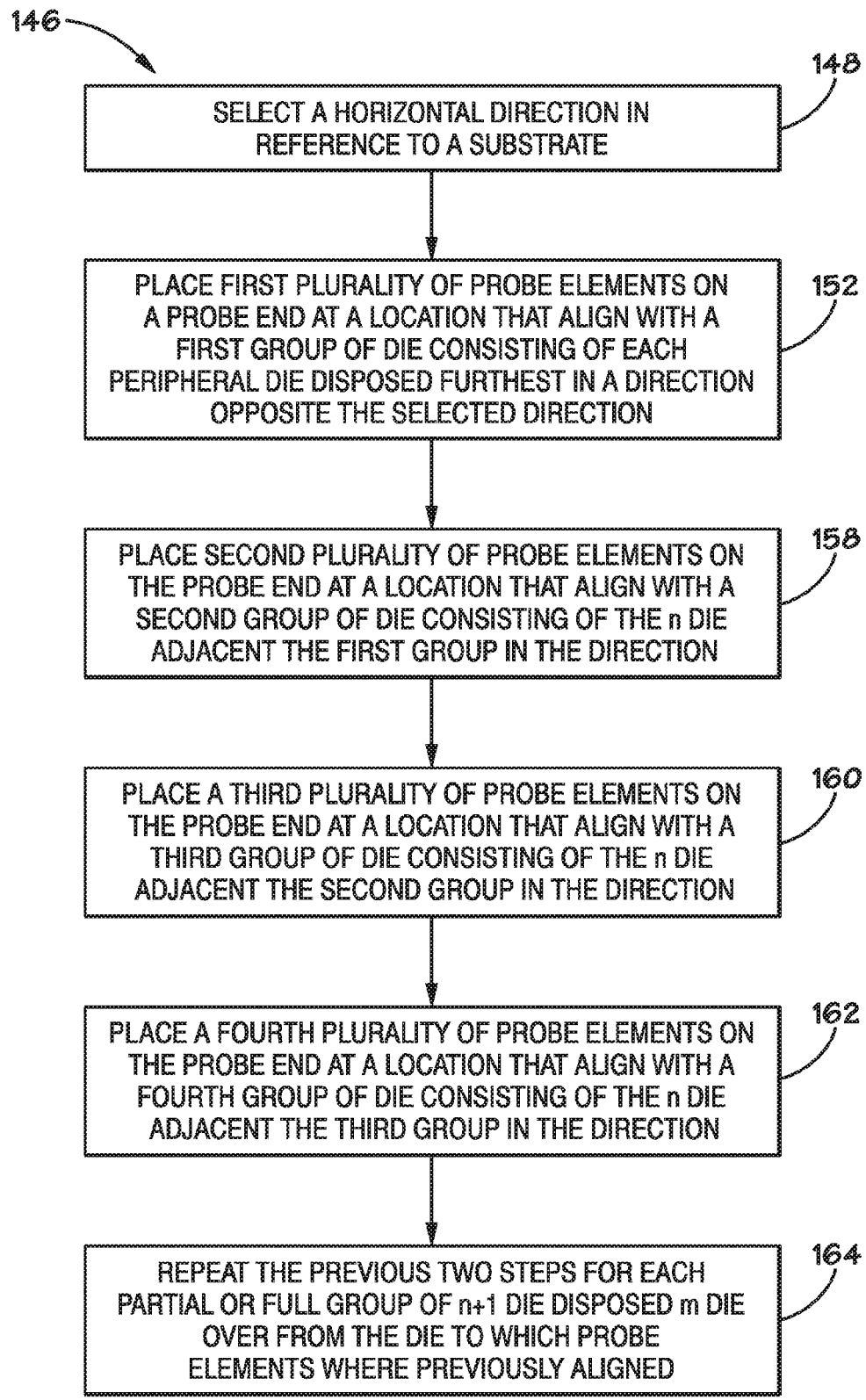
FIG. 11 illustrates a procedure for laying out probe elements on a probe card in accordance with an embodiment of the present invention.

Turning to FIG. 11, the embodiment of the procedure 146 begins with selecting a horizontal direction in reference to a substrate 100, as depicted block 148. Here, the term "horizontal" refers to a direction that is parallel to the surface of the substrate 100 on which die 102 are formed. Thus, for example, the x or y direction in FIG. 1, corresponding to the directions in which the rows 104 and columns 106 extend, may be selected.

Figure 12:
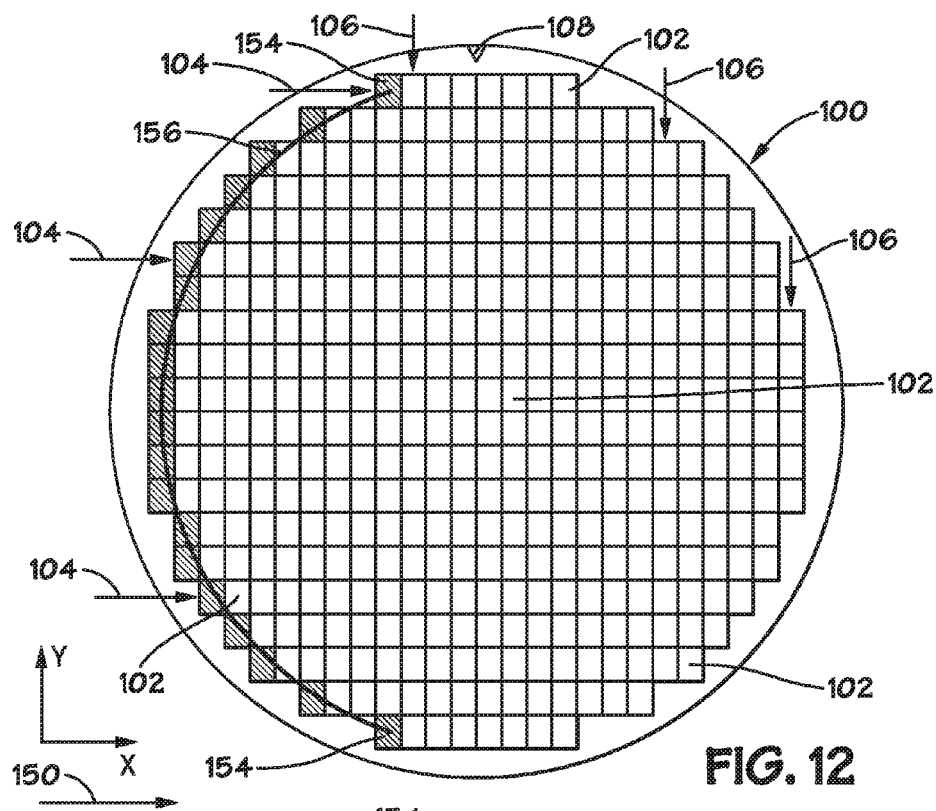
FIGS. 12-15 illustrate acts in the procedure of FIG. 11 in accordance with an embodiment of the present invention.
Figure 13:
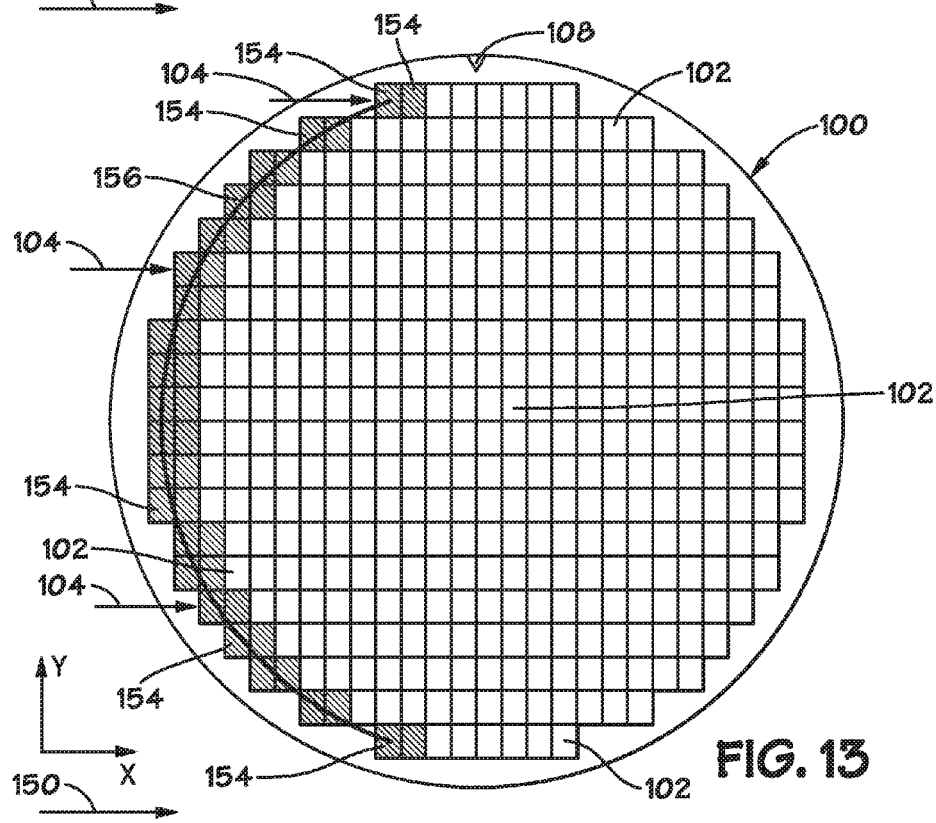
Figure 14:
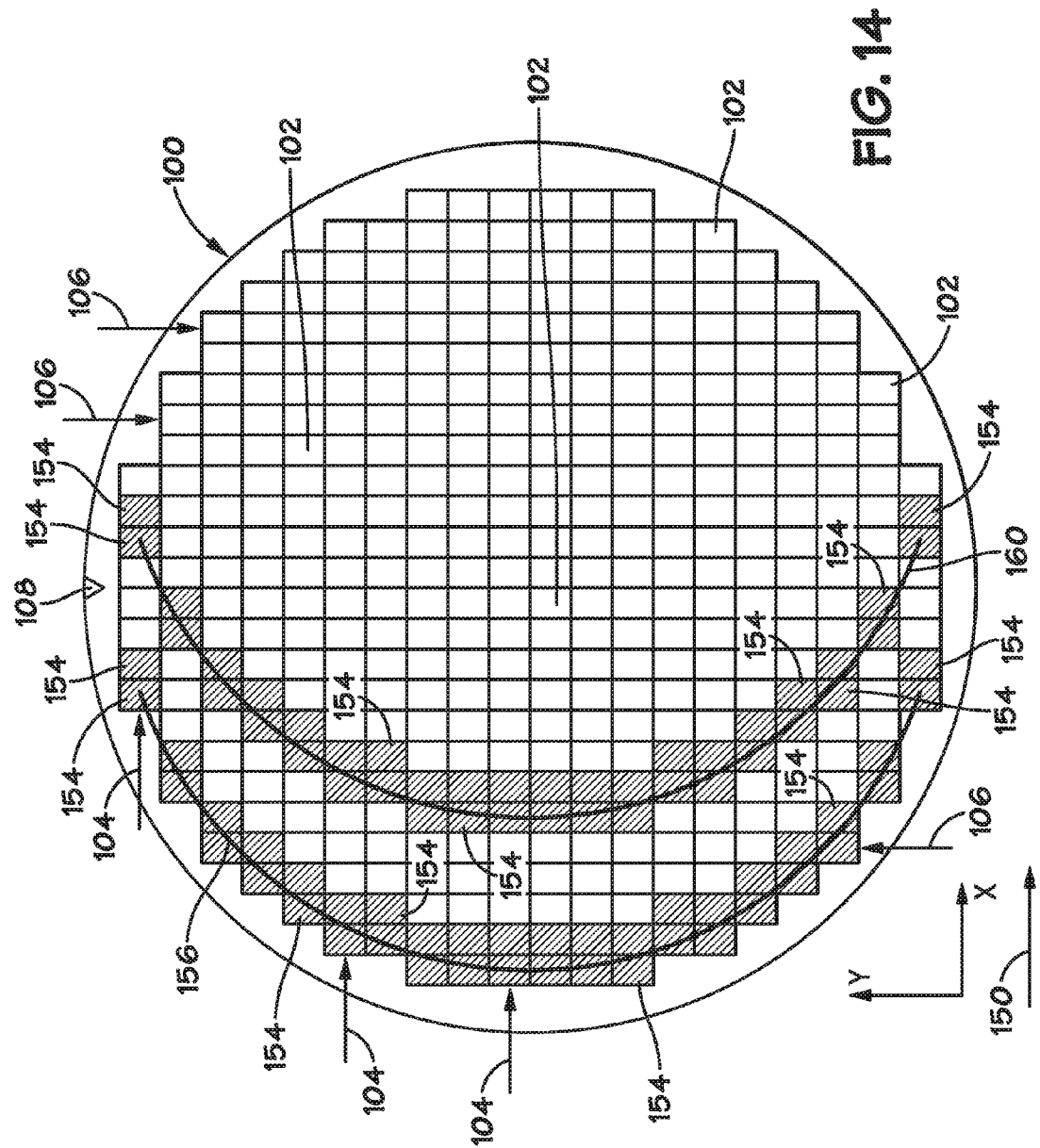

FIG. 12 depicts a reference substrate 100 that identifies die 154 to which probe elements 112 are to be aligned during the procedure described by FIG. 11, as described further below. In FIG. 12, the selection of a direction is indicated by arrow 150, which corresponds to the direction in which the rows 104 extend (the x-direction).

Next, a first subset of probe elements 112 may be placed on a probe card 128 at locations that align with a first subset of die 154 consisting of each peripheral die 154 disposed furthest in a direction opposite the selected direction, as depicted by block 152 of FIG. 11. The shaded die 154 illustrate the position of probe elements 112 that may be positioned in accordance with this act. On circular substrates 100, the subset of probe elements 112 positioned in this step may generally form an arc 156.

Returning to FIG. 11, next in the embodied procedure 146, a second subset of probe elements 112 may be positioned on the probe card 128 at locations that align with a second subset of die 154 consisting of the n die adjacent the first subset of die 154 in the selected direction 150, as depicted by block 158. In the embodiment illustrated by FIG. 13, n=1, and the direction 150 is left-to-right (i.e., in the x-direction). Thus, the first die 154 to the right of the previously aligned to die 154 (in FIG. 12) define the position of the probe elements 112 positioned in this act. It should be noted that this step, like many of the other steps and features discussed herein, is optional.

Next, another arc 160 is formed by placing a third subset of probe elements 112 on the probe card 128 at locations that align with a third subset of die 154 consisting of the die m die away from the second subset in the direction 150, as depicted by block 160 in FIG. 11. That is, unoccupied space corresponding to m die is defined on the probe card 128 between the previously placed probe elements 112 and the probe elements 112 placed in the present act. In the embodiment depicted by FIG. 14, m=3, and the next subset of probe elements 112 are placed to align with a subset of die 154 three die to the right of the die 154 to which the previously placed subset of probe elements 112 aligned. Again, the probe elements 112 in this subset may generally form an arc 160 located a distance corresponding to m+n+1 die away from the previous arc 156 in the direction 150.

In some embodiments, a fourth subset of probe elements 112 may be placed on the probe card 128 at locations that align with a fourth subset of die 154 including the n die adjacent the third subset of die 154 in the direction 150, as depicted by block 162 in FIG. 11. It should be noted that, as with the other acts, this act is optional.

Next, the acts depicted by blocks 160 and 162 of FIG. 11 may be repeated for each full or partial subset of n+1 die disposed m die over in the direction 150 from the die 154 to which probe elements 112 were previously aligned, as depicted by block 164. Four more repetitions are exemplified by FIG. 15, in which four additional arcs 166 of probe elements 112 are placed to align with die 154.

Figure 15:
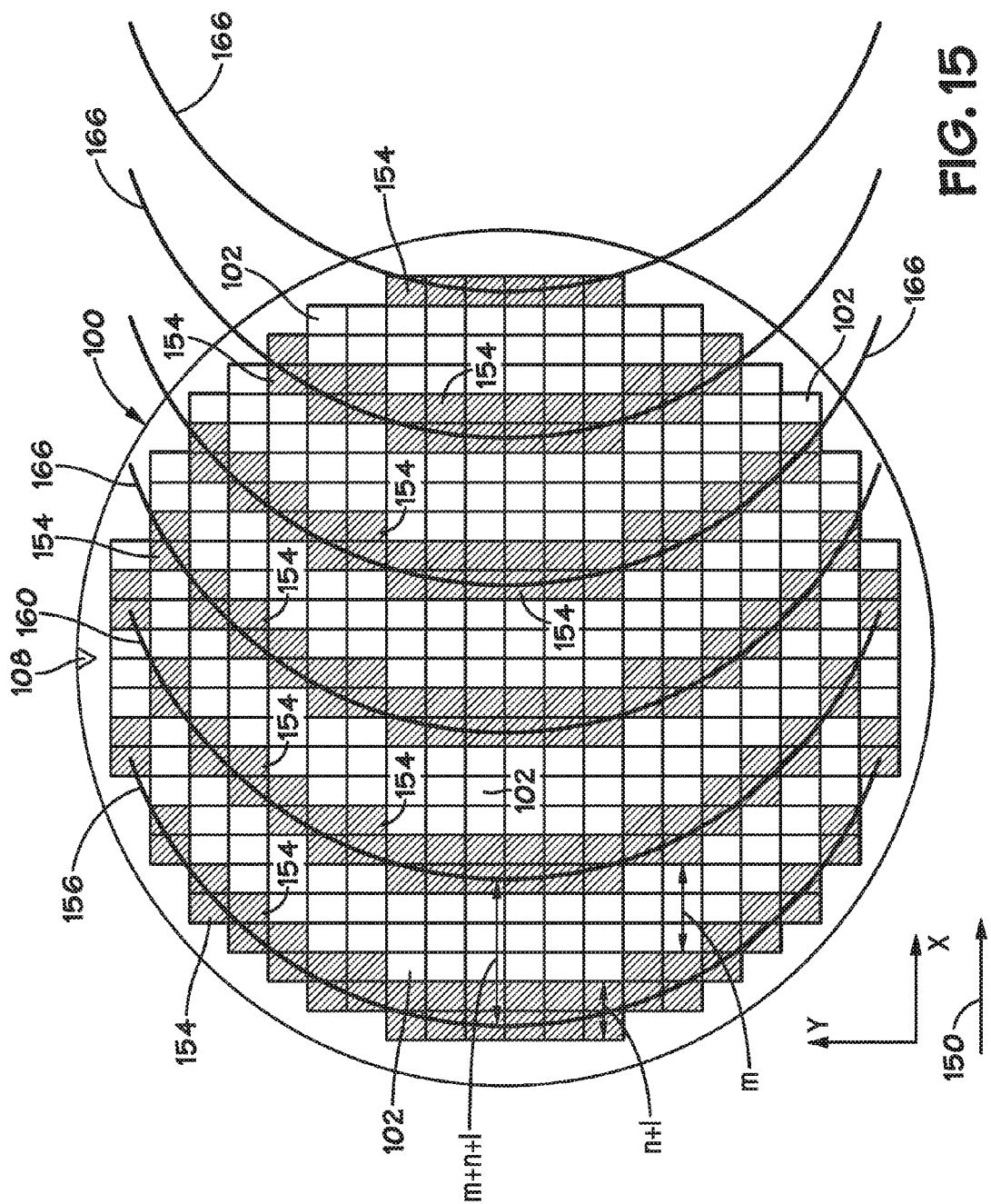

As illustrated by the pattern of die 154 to which probe elements 112 are aligned in FIG. 15, the probe elements 112 may generally form a series of arcs 156, 160, and 166. Each arc 156, 160, and 166 may represent a subset of die 154 plus n adjacent die 154 in the direction 150 on the substrate 100 to which a probe element 112 is aligned. The arcs 156, 160, and 166 may have a center that is shifted in the direction 150 by a distance corresponding to n+m+1 away from other arcs 156, 160, or 166. In the present embodiment, m and n are integer multiples of the pitch of the die 102 in the selected direction 150.

A taxonomy of the previously discussed embodiments may be developed with reference to the parameters described in FIGS. 11-15. For example, FIGS. 5, 7, 9, and 15 depict probe card 128 layouts in which the selected direction 150 is to the right (the x-direction) relative to the notch 108 on the substrate 100. In contrast, FIG. 8 depicts a probe card 128 where the selected direction 150 is down (or in the negative y-direction) relative to the notch 108 on the substrate 100.

The parameters m and n from FIG. 15 may also be used to characterize probe card 128 layouts. FIGS. 5, 8, and 9 depict probe card 128 layouts with n values equal to zero, and FIGS. 7 and 15 depict probe card 128 layouts with n values equal to 1. Similarly, FIGS. 5 and 8 illustrate probe card 128 layouts with m values of 1, FIGS. 7 and 9 illustrate probe cards 128 with m values of 2, and FIG. 15 illustrates a probe card layout with an m value of 3.

Other embodiments may include probe cards 128 with layouts characterized by different selected directions 150, m values, n values, or combinations thereof. For instance, the selected direction 150 may be left, right, up, down, or at some other angle. Similarly, in certain embodiments, the m value and/or n value may be 1, 2, 3, 4, 5, 6, 7, 8, 9, 10, or other values.

The number of touchdowns a probe card 128 performs to test all of the die 102 on the substrate 100 may correlate to the m and n values. For instance, in some embodiments, the m value may equal n+1 to produce a two-touchdown probe card 128, e.g., in the embodiment of FIG. 5. In another example, the m value may be twice as large as n+1 to produce a three-touchdown probe card 128, e.g., in the embodiment of FIG. 9. More generally, in certain embodiments, the probe card 128 may be characterized as an x-touchdown probe card 128 where x is equal to 1+m/(n+1).

To summarize, certain probe cards 128 developed in accordance with the acts described by FIGS. 11-15 facilitate use of automated test equipment to its full capacity. As explained above, various factors may limit the number of die that automated test equipment may test in parallel. These factors may determine the number of probe elements 112 on a probe card 128, which may be less than the number of die 102 on the substrate 100, and which may lead to multiple touchdowns to test all of the die 102 on the substrate 100. Unused probe elements 112 during any of the touchdowns may be indicative of unused automated test equipment capacity. Certain embodiments may minimize unused capacity by minimizing the number of unused probe elements and testing many die simultaneously. That is, certain embodiments may be both highly parallel (i.e., they may use a large portion of the capacity of the automated test equipment in an individual touchdown) and highly efficient (i.e., they may use a large portion of the capacity of the automated test equipment in every touchdown). Thus, the previously discussed embodiments may tend to reduce the amount of automated test equipment capacity that is unused during the testing of a substrate 100.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A probe card comprising:
   a first subset of probe elements configured to align with only a first subset of die, wherein the first subset of die comprises peripheral die, wherein the peripheral die comprise each die disposed furthest in a direction opposite a selected direction; and
   a second subset of probe elements configured to align with only a second subset of die, wherein the second subset of die comprises peripheral shifted die, wherein the peripheral shifted die comprise the die located m die away from the first subset of die in the direction toward the selected direction.

2. The probe card of claim 1, wherein m=2.

3. A probe card comprising:
   a plurality of probe elements configured to simultaneously test a first plurality of die on a substrate, wherein each of the plurality of probe elements is always employed to test a respective one of the first plurality of die on the substrate, wherein the plurality of probe elements is further configured to simultaneously test a second plurality of die on the substrate, wherein each of the plurality of probe elements is always employed to test a respective one of the second plurality of die on the substrate.

4. The probe card of claim 3, wherein the first plurality of die and the second plurality of die are mutually exclusive.

5. The probe card of claim 3, wherein the probe card is configured to shift a distance generally corresponding to a single die when consecutively testing the first plurality of die and the second plurality of die.

6. The probe card of claim 3, wherein the substrate comprises a plurality of integrated circuit die.

7. The probe card of claim 6, wherein the plurality of integrated circuit die comprise NAND flash memory.

8. The probe card of claim 6, wherein the integrated circuit die is segmented on the substrate and packaged.

9. The probe card of claim 3, wherein an efficiency ratio of probe elements used per test performed is 100%.

10. A probe card comprising:
   a first subset of probe elements configured to align with only a first subset of die, wherein the first subset of die comprises peripheral die, wherein the peripheral die comprise each die disposed furthest in a direction opposite a selected direction; and
   a second subset of probe elements configured to align with only a second subset of die, wherein the second subset of die comprises peripheral shifted die, wherein the peripheral shifted die comprise the die located m die away from the first subset of die in the direction toward the selected direction, wherein the first subset of probe elements and the second subset of probe elements generally form a respective arc.

11. The probe card of claim 10, wherein m=2.

* * * * *